United States Patent
Choi

(10) Patent No.: US 11,593,202 B2
(45) Date of Patent: Feb. 28, 2023

(54) DATA PROCESSING SYSTEM, MEMORY CONTROLLER THEREFOR, AND OPERATING METHOD THEREOF

(71) Applicant: SK hynix Inc., Icheon (KR)

(72) Inventor: Kyu Hyun Choi, Icheon (KR)

(73) Assignee: SK Hynix Inc., Icheon (KR)

( * ) Notice: Subject to any disclaimer, the term of this patent is extended or adjusted under 35 U.S.C. 154(b) by 30 days.

(21) Appl. No.: 17/027,301

(22) Filed: Sep. 21, 2020

(65) Prior Publication Data

US 2021/0311831 A1  Oct. 7, 2021

(30) Foreign Application Priority Data

Apr. 7, 2020 (KR) .................. 10-2020-0042030

(51) Int. Cl.
*G06F 11/10* (2006.01)
*G06N 3/08* (2023.01)
(Continued)

(52) U.S. Cl.
CPC ........... *G06F 11/1076* (2013.01); *G06N 3/08* (2013.01); *G06F 11/1004* (2013.01); *G06F 11/1012* (2013.01); *G06F 11/1068* (2013.01); *G11C 11/5628* (2013.01); *G11C 16/26* (2013.01); *G11C 29/42* (2013.01); *H04L 1/0072* (2013.01); *H04L 1/0083* (2013.01)

(58) Field of Classification Search
CPC ............ G06F 11/1012; G06F 11/1076; G06F 11/1068; G06F 11/1004; G06N 3/08; H04L 1/0083; H04L 1/0072; G11C 11/5628; G11C 16/26; G11C 29/42

See application file for complete search history.

(56) References Cited

U.S. PATENT DOCUMENTS 7,701,850 B2 *  4/2010  Kim ................. H04L 25/03343
                                                    370/230
9,063,857 B2 *  6/2015  Kim ..................... H03M 13/611
(Continued)

FOREIGN PATENT DOCUMENTS

KR     20130130485 A    12/2013
KR      101934204 B1    12/2018

OTHER PUBLICATIONS

D. T. Nguyen et al., "An approximate memory architecture for a reduction of refresh power consumption in deep learning applications," Published in: 2018 IEEE International Symposium on Circuits and Systems (ISCAS), May 27-30, 2018, pp. 1-5, Florence, Italy.

(Continued)

*Primary Examiner* — Cynthia Britt
*Assistant Examiner* — Sazzad Hossain

(57) ABSTRACT

A data processing system may include a memory module; and a controller configured to exchange data with the memory module in response to a request received from a host. The controller divide a first data into a first data group to error correction and a second data group not to error correction in response to the first data and a first data write request received from the host, generates a first meta data for error correction for the first data group, configures a first data chunk that includes the first data and the first meta data, and transmits the first data chunk to the memory module.

23 Claims, 10 Drawing Sheets

(51) Int. Cl.
 *H04L 1/00* (2006.01)
 *G11C 11/56* (2006.01)
 *G11C 29/42* (2006.01)
 *G11C 16/26* (2006.01)

(56) References Cited

U.S. PATENT DOCUMENTS

| | | | |
|---|---|---|---|
| 9,286,156 B2* | 3/2016 | Kim | G06F 11/1012 |
| 10,553,295 B2* | 2/2020 | Song | G11C 16/10 |
| 10,684,796 B2* | 6/2020 | Kim | G06F 3/0656 |
| 2014/0157082 A1* | 6/2014 | Kim | G06F 11/1012 |
| | | | 714/763 |
| 2019/0294500 A1* | 9/2019 | Hara | G06F 11/1072 |
| 2021/0132832 A1* | 5/2021 | So | G06N 3/063 |

OTHER PUBLICATIONS

Jamie Liu et al., "RAIDR: Retention-Aware Intelligent DRAM Refresh," Published in: 2012 39th Annual International Symposium on Computer Architecture (ISCA), Jun. 9-13, 2012, pp. 1-12, Portland, OR, USA.

* cited by examiner

DATA PROCESSING SYSTEM, MEMORY CONTROLLER THEREFOR, AND OPERATING METHOD THEREOF

CROSS-REFERENCE TO RELATED APPLICATION

This application claims priority under 35 U.S.C. § 119 to Korean Patent Application No. 10-2020-0042030 filed on Apr. 7, 2020, which is incorporated herein by reference in its entirety.

BACKGROUND

1. Field

Exemplary embodiments relate to a semiconductor integrated device, and more particularly, to a data processing system, a memory controller, and an operating method thereof.

2. Discussion of the Related Art

As the interest and importance for artificial intelligence applications and big data analysis increases, there is an increasing demand for computing systems capable of efficiently processing a large amount of data.

Previous computing systems have focused on processor-based computing, whereas recent computing systems have evolved into data-based computing or memory-based computing capable of processing massive amounts of data in parallel and at high speeds. Accordingly, the computation performance of a computing device can be maximized or enhanced because a data bottleneck phenomenon between a processor and a memory is reduced.

However, the improvement in performance and speed of the computing device may result in an increased energy consumption, generation of heat, and other drawbacks.

SUMMARY

In an embodiment, a data processing system may include a memory module; and a controller configured to exchange data with the memory module in response to a request received from a host. The controller divide a first data into a first data group to error correction and a second data group not to error correction in response to the first data and a first data write request received from the host, generates a first meta data for error correction for the first data group, configures a first data chunk that includes the first data and the first meta data, and transmits the first data chunk to the memory module.

In an embodiment, a memory controller may configured to exchange data with a memory module in response to a request received from a host, the memory controller comprising an error check and correction (ECC) device. The ECC generates a meta data based on a data received from the host; and transmits, to the memory module, a data chunk that includes the data and the meta data to store the data chunk in the memory module. The data includes a first part used to generate the meta data; and a second part that is selectively used to generate the meta data based on an operation mode of the memory controller.

In an embodiment, an operating method of a memory controller that exchanges data with a memory module in response to a request received from a host, the method comprising: dividing, by the memory controller, a first data into a first data group to error correction and a second data group not to error correction in response to the first data and a first data write request received from the host; generating, by the memory controller, a first meta data for error correction using a first data group; and transmitting, by the memory controller, to the memory module, a first data chunk that includes the first data and the first meta data.

DETAILED DESCRIPTION

Figure 1:
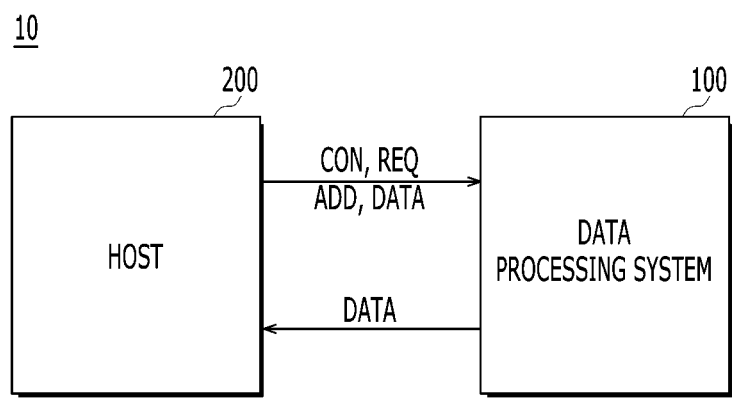
FIG. 1 is a diagram illustrating a configuration of an electronic device including a data processing system according to an embodiment.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

FIG. 1 is a diagram illustrating a configuration of an electronic device 10 including a data processing system according to an embodiment.

Referring to FIG. 1, the electronic device 10 according to an embodiment may include a host 200 and a data processing system 100 communicating with the host.

The host 200 may transmit to the data processing system 100 a control signal CON, a request REQ, an address ADD related to or associated with data processing, and/or data DATA. The data processing system 100 may perform an operation corresponding to the request REQ and in response to the control signal CON, the request REQ, the address ADD and/or the data DATA received from the host 200, and may transmit to the host 200 data DATA derived or obtained as a result of the processing.

When the amount of data DATA transmitted and received between the data processing system 100 and the host 200 increases, the host 200 may process an operation dependent on the data processing system 100. That is, the data processing system 100 may be configured to not only store or output data, but also autonomously compute the data DATA.

The data processing system 100 may include a high performance computing (HPC) device for performing a high-level operation in a cooperative manner using a super computer, a computer cluster, or an array of networked information processing devices or servers for individually processing the data DATA.

The data processing system 100 may include a plurality of data processing devices configured to store or compute the data DATA and output the computed the data DATA.

The data processing device or devices of the data processing system 100 may include one or more server computers, one or more racks of each of the server computers, and/or one or more boards of each of the racks.

As described herein, the data processing system 100 may include a plurality of data processing devices in order to improve or enhance information processing performance of the system 100. The data processing devices may be electrically networked to mutually or collectively transmit and receive or share data.

Figure 2:
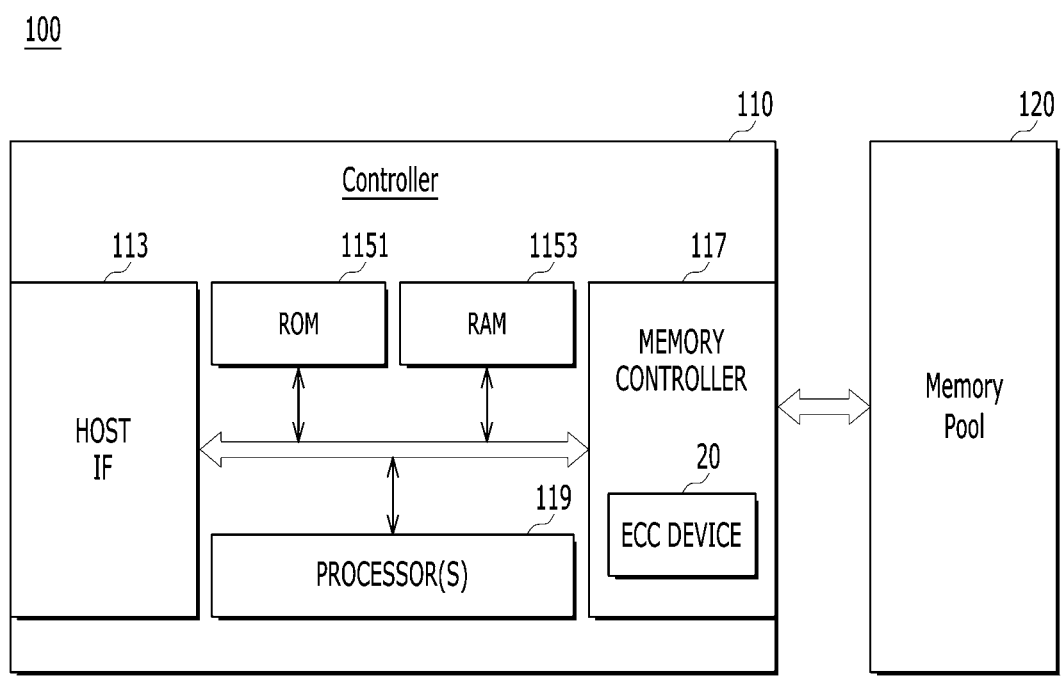
FIG. 2 is a diagram illustrating a configuration of the data processing system according to an embodiment.

FIG. 2 is a diagram illustrating a configuration of the data processing system 100 according to an embodiment.

Referring to FIG. 2, the data processing system 100 according to an embodiment may include a controller 110 and a memory pool 120. In an embodiment, the controller 110 is a digital circuit that manages the flow of data going to and from the memory pool 120. The controller 110 may be formed on a chip independently or integrated with one or more other circuits.

The controller 110 may be coupled to the memory pool 120 and may control data input and output to and from the memory pool 120. The controller 110 may generate a command CMD from the request REQ received from the host 200, and may process data in cooperation with the memory pool 120 based on the generated command CMD. Processing the data may include an operation of reading data stored in the memory pool 120, an operation of computation based on the read data, and/or an operation of providing the computed data to the host 200 or the memory pool 120.

The memory pool 120 may store data under the control of the controller 110 or output data stored therein. The memory pool 120 may include a plurality of memory modules and may be configured to be accessible in a page (or byte) unit. That is, the controller 110 may access the memory pool 120 in a page unit.

In an embodiment, the controller 110 may include a host interface (IF) 113, a ROM (read-only memory) 1151, a RAM (random-access memory) 1153, a memory controller 117, and at least one processor 119.

The host IF 113 may provide an interface between the host 200 and the controller 110. The host IF 113 may store and schedule a command provided by the host 200 and may provide the command to the processor 119. The host IF 113 may provide the memory controller 117 with write data provided by the host 200 or may provide the host 200 with read data provided by the memory pool 120 through the memory controller 117 or data output by the processor 119.

The ROM 1151 may store a program code necessary or utilized for or during an operation of the controller 110, for example, firmware or software, and may store code data used by program codes.

The RAM 1153 may store data necessary or utilized for or during an operation of the controller 110 or data generated by the controller 110.

The memory controller 117 may transmit, to the memory pool 120, data provided by the host IF 113 or may receive data read from the memory pool 120 and provide the read data to the host IF 113 or the processor 119.

The processor 119 may include a plurality of cores and may compute a program code of an application for which offload processing has been requested by the host 200, while exchanging data with the memory pool 120. Offload processing means that an operation of the host 200 is entrusted to and/or performed by another device, for example, the data processing system 100.

As described herein, an application performing or associated with big data analysis or machine learning often utilizes operations having large amounts of data. In line with such requirements, research associated with the data processing device 100 being capable of processing an operation of the host 200 by entrusting the operation to a computing engine, (e.g., the processor 119) has been carried out. In such an electronic device 10, the host 200 can perform another task while an operation for a large amount of data is performed by the data processing system 100, thereby improving and enhancing the work efficiency.

In an embodiment, when offload processing of an application is requested, the host 200 may transmit an initial parameter to the data processing system 100, so that the initial parameter is stored in the memory pool 120. The processor 119 may read the initial parameter stored in the memory pool 120 and may execute or may compute a program code of the application.

The memory controller 117 may include an error check and correction (ECC) device 20 for guaranteeing or ensuring the accuracy of data exchanged with the memory pool 120.

The ECC device 20 may encode data (or message bits) provided by the host 200 or the processor 119 using a set method or algorithm, may store the encoded data in the memory pool 120, may decode data read from the memory pool 120 using a set method or algorithm, and/or may provide the decoded data to the host 200 or the processor 119. In an embodiment, upon or during a data write operation, the ECC device 20 may generate a meta bit (e.g., a meta data or a parity bit) from a message bit, and may store, in the memory pool 120, a data chunk including the message bit and the parity bit. Upon or during a data read operation, the ECC device 20 may detect an error in a message bit based on a meta bit included in a data chunk read from the memory pool 120, and may correct the error.

In an embodiment, the ECC device 20 may use an error correction code capable of detecting an error of at least 2 bits based on a data chunk and perform single error correction double error detection (SECDED). In an embodiment, the error correction code may be a Hamming code, but the present disclosure is not limited thereto.

The data processing system 100 may operate in a first operation mode (e.g., a first data write request mode or a first data read request mode) or a second operation mode (e.g., a second data write request mode or a second data read request mode) based on the type of application for which processing has been requested by the host 20.

The first operation mode may be an acceleration application processing mode, including "major data," or data generated through processing an application and whose accuracy needs to be guaranteed, and "minor data," or other data, which may be lost. The acceleration application may be an artificial intelligence application that involves, includes, or is associated with a neural network operation, such as a deep learning operation.

The second operation mode may be an application processing mode including data generated through processing an application, where the data is generally major data.

The controller 110 may set the operation mode of the memory controller 117 to the first operation mode or the second operation mode based on the control signal CON received from the host 200.

When the operation mode is set as the first operation mode, the memory controller 117 may generate a meta bit for error correction with respect to only a first data group, e.g., a part of a message bit, in response to receiving a write request for the message bit from the host 200 or the processor 119. The memory controller 117 may configure a data chunk including the message bit and the meta bit, and may transmit, to the memory pool 120, a write command including the data chunk.

When the operation mode is set as the first operation mode, the memory controller 117 may generate read data by correcting an error of a first data group, included in a data chunk received from the memory pool 120, based on a meta bit and in response to receiving a read request from the host 200 or the processor 119. The memory controller 117 may transmit the generated read data to the host 200 or the processor 119.

When the operation mode is set as the second operation mode, the memory controller 117 may generate a meta bit for error correction for all message bits in response to receiving a write request for a message bit from the host 200 or the processor 119, may configure a data chunk, and may store the data chunk in the memory pool 120.

Furthermore, in the second operation mode, when receiving a read request from the host 200 or the processor 119, the memory controller 117 may receive a data chunk from the memory pool 120, may generate read data by correcting an error of all message bits based on a meta bit, and may transmit the generated read data to the host 200 or the processor 119.

In another aspect, when receiving a message bit that is divided into a first part used to generate a meta bit and a second part not used to generate the meta bit from the host 200 or the processor 119, the memory controller 117 may generate the meta bit and store, in the memory pool 120, a data chunk including the message bit and the meta bit.

Figure 3:
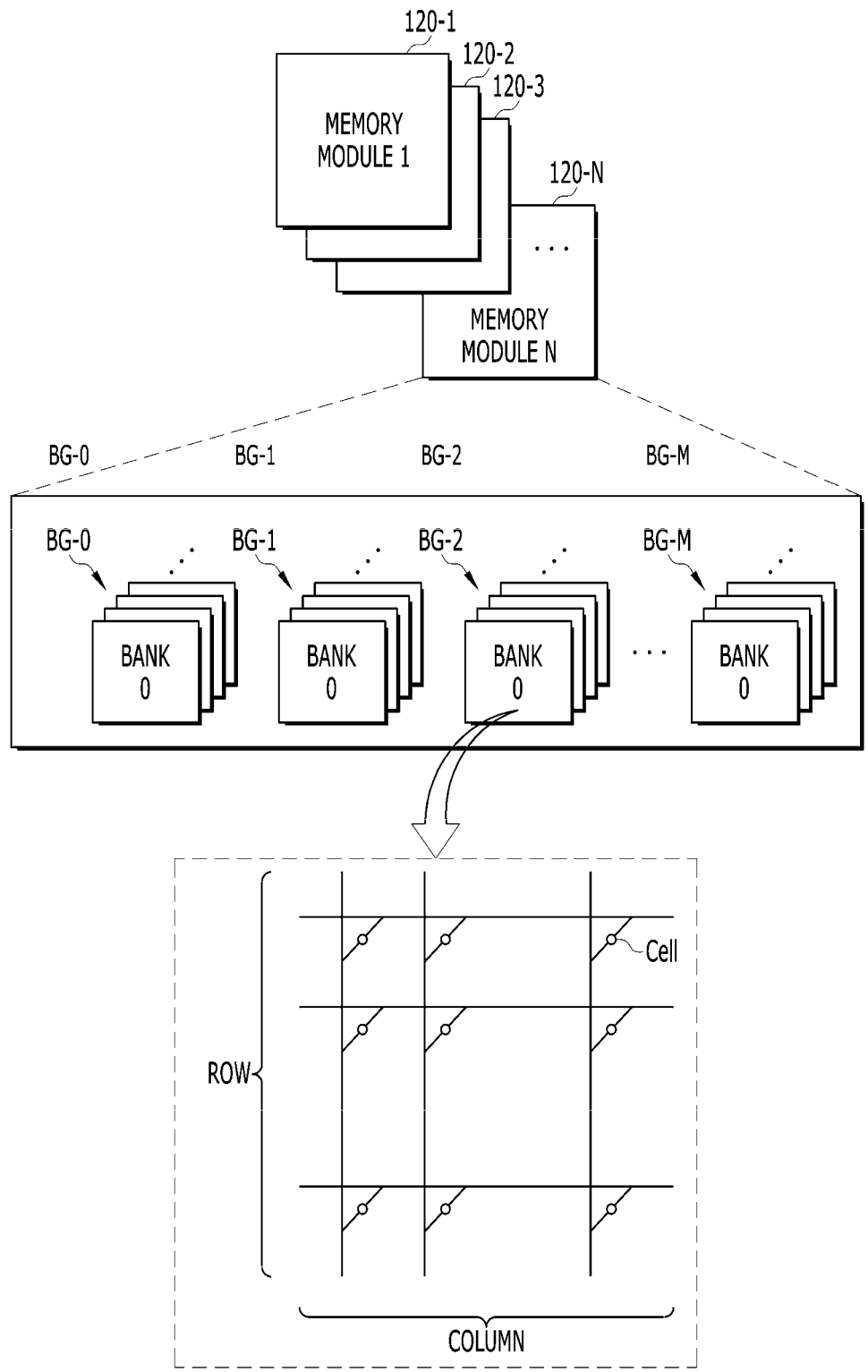
FIG. 3 is a diagram illustrating a configuration of a memory pool according to an embodiment.

FIG. 3 is a diagram illustrating a configuration of the memory pool 120 according to an embodiment.

In an embodiment, the memory pool 120 may include a plurality of memory modules 120-1 to 120-N.

Each of the memory modules 120-1 to 120-N may include a plurality of bank groups BG-0 to BG-M. Each of the plurality of bank groups BG-0 to BG-M may include a plurality of banks BANK. Each of the banks BANK may include a plurality of memory cells coupled between a plurality of row lines ROW (or word lines) and a plurality of column lines COLUMN (or bit lines). For example, memory cells coupled to one word line may form one page.

The memory modules 120-1 to 120-N may include volatile memory modules, and may further include nonvolatile memory modules in addition to the volatile memory modules.

The volatile memory module may be configured to include, for example, a dynamic random access memory (DRAM) and/or a static random access memory (SRAM). The nonvolatile memory module may be configured to include, for example, at least one of an electrically erasable and programmable ROM (EEPROM), a NAND flash memory, a NOR flash memory, a phase-change RAM (PRAM), a resistive RAM (ReRAM) a ferroelectric RAM (FRAM), and a spin torque transfer magnetic RAM (STT-MRAM).

In an embodiment, each of the memory modules 120-1 to 120-N may be a memory module of a single in-line memory module (SIMM) or dual inline memory module (DIMM) form, including multiple memory chips mounted on a module board, or may be a high bandwidth memory (HBM). The HBM module may include a plurality of HBMs and at least one hardware accelerator mounted on an interposer. In an embodiment, the memory modules 120-1 to 120-N may be configured in a form including the controller 110 on a module board or in a form including the controller 110 in a base die in the case of an HBM module.

In response to the control signal CON provided by the host 200, the controller 110 of the data processing system 100 illustrated in FIGS. 1 to 3 may read input data and an initial weight from the memory pool 120, may load the input data and initial weight onto an internal memory, and may execute or compute a program code. A program code of an application may be stored in a memory of the host 200 or in the memory pool 120. Data generated when the program code of the application is executed may be stored in the memory pool 120.

In an embodiment, the host 200 may offload machine learning processes or an artificial intelligence application, for example, a neural network operation, to the data processing system 100, and may request the data processing system 100 to process the machine learning processes or the artificial intelligence application. Data used while the neural network operation is processed, for example, a weight classified for each layer included in a neural network model, may be stored in the memory pool 120, and may be reused for an operation.

A deep learning algorithm used in an artificial intelligence application may be divided into a training process and an inference process.

The training process may be a process of training a model through or using input data. The inference process may be a process of performing a service, such as recognition, based on a trained model.

The deep learning algorithm may autonomously have a fault tolerance characteristic. Accordingly, in the inference process, a quantization scheme for intentionally reducing the accuracy of a weight is used in order to increase an operation speed and reduce the amount of memory used. Accordingly, the use of the quantization scheme may not affect accuracy in deriving inference results, despite some data being lost.

In this technology, in an application processing mode (e.g., the first operation mode) that includes "major data" (e.g., some data generated when processing an application) and "minor data" (e.g., some data generated when processing an application), variable error correction may be performed based on the importance of the data. For example, minor data, such as a decimal portion of a weight used in an operation of the deep learning algorithm, may not be protected by an error correction code, and only major data of the weight may be intensively protected by the error correction code.

In an embodiment, a weight used in the operation of the deep learning algorithm may have a fixed point form or floating point form. A weight of a fixed point form may be divided into a sign, an integer part, and a decimal part. In this case, the sign and the integer part may be selected or used as major data. A weight of a floating point form may be divided into a sign, an exponent, and a mantissa. In this case, the sign and the exponent may be selected or used as major data.

Accordingly, the error recovery performance for major data can be improved or enhanced compared to error detection and correction of all message bits.

In an embodiment, a DRAM is used to store data derived in the operation of the deep learning algorithm.

The DRAM may perform a refresh operation before a data retention time elapses, in order to maintain data stored in the DRAM. The refresh operation may consume more power and energy when a DRAM process is sub-divided and a memory capacity is increased. Since another operation cannot be performed in a bank on which a refresh operation is being performed, a refresh operation may also negatively influence the entire DRAM performance.

Thus, as described herein, error recovery performance for major data can be improved or guaranteed. Further, power consumption can be significantly reduced because the refresh cycle of a memory module performed for maintaining a message bit is increased.

Figure 4:
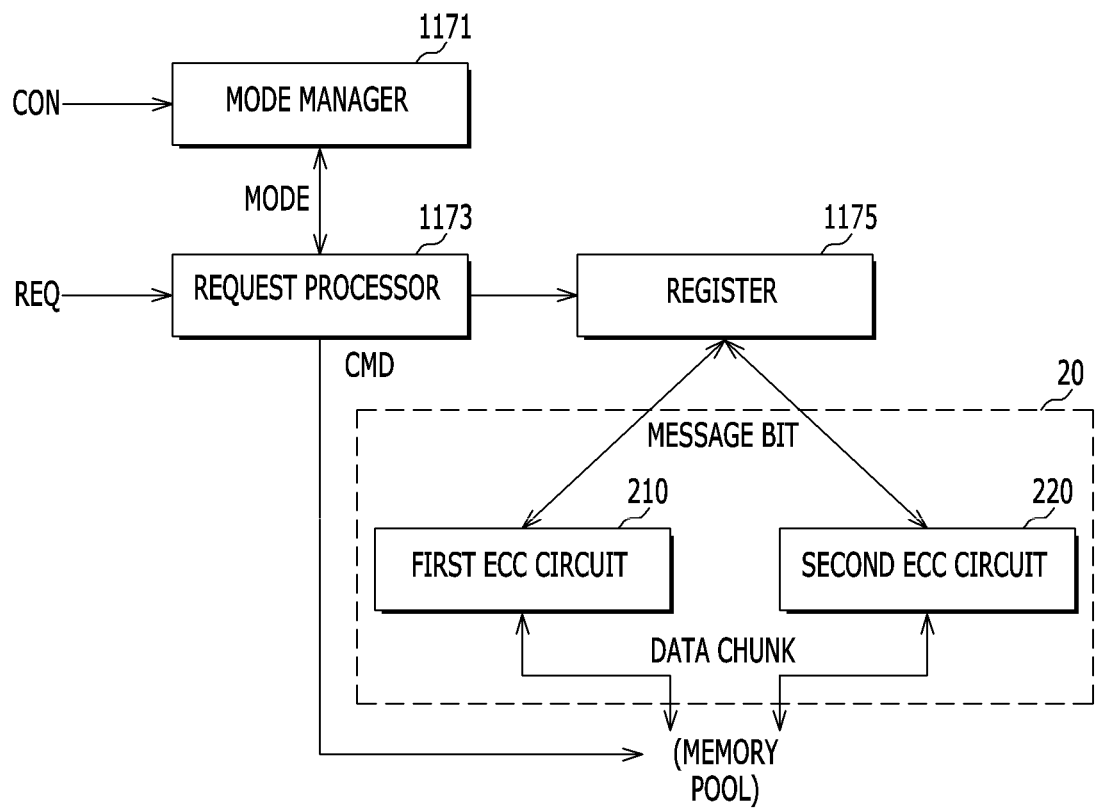
FIG. 4 is a diagram illustrating a configuration of a memory controller according to an embodiment.

FIG. 4 is a diagram illustrating a configuration of the memory controller 117 according to an embodiment.

Referring to FIG. 4, the memory controller 117 according to an embodiment may include a mode manager 1171, a request processor 1173, a register 1175, and the ECC device 20. The ECC device 20 may include a first ECC circuit 210 and a second ECC circuit 220.

The mode manager 1171 may set an operation mode of the memory controller 117 in response to the control signal CON received from the host 200 or the processor 119. In an embodiment, the operation mode may be any one of the first operation mode (e.g., an acceleration application processing mode including "major data" from data generated in a process of processing an application and whose accuracy needs to be guaranteed and "minor data" from the data and may be lost), and the second operation mode (e.g., an application processing mode including data generated in a process of processing an application and generally major data).

In an embodiment, the host 200 or the processor 119 may set the operation mode of the memory controller 117 by transmitting a mode setting flag or a mode setting command to the mode manager 1171. The mode setting flag or the mode setting command may be configured to apply the same ECC policy to the entire memory pool 120. In another embodiment, the mode setting flag or the mode setting command may be configured to apply a separate or distinct ECC policy to each of memory modules within the memory pool 120 and/or each of memory banks within each of the memory modules.

The request processor 1173 may store, in the register 1175, the request REQ received from the host 200. Furthermore, the request processor 1173 may parse the request REQ while driving the ECC device 20 based on an operation mode MODE set by the mode manager 1171 and may transmit the command CMD to the memory pool 120.

The ECC device 20 may selectively operate the first ECC circuit 210 or the second ECC circuit 220 under the control of the request processor 1173. In an embodiment, the ECC device 20 may drive the first ECC circuit 210 in the first operation mode and may drive the second ECC circuit 220 in the second operation mode.

When a write request is received, the first ECC circuit 210 may receive a message bit, included in the write request, from the register 1175, may generate a meta bit by extracting a first data group from the message bit, may configure a data chunk, and may transmit the data chunk to the memory pool 120. The second ECC circuit 220 may receive a message bit, included in the write request, from the register 1175, may generate a meta bit, may configure a data chunk, and may transmit the data chunk to the memory pool 120. The memory pool 120 may receive the data chunk from the first ECC circuit 210 or the second ECC circuit 220 and may store the data chunk in a memory cell in response to a write command (CMD=WT) received from the request processor 1173.

When receiving a read request, the memory pool 120 may read a data chunk from a memory cell in response to a read command (CMD=RD), and may transmit the read data chunk to the first ECC circuit 210 or the second ECC circuit 220. The first ECC circuit 210 may receive the data chunk from the memory pool 120, may generate a message bit by correcting an error of a first data group using a meta bit included in the data chunk, and may store the generated message bit in the register 1175. The second ECC circuit 220 may receive the data chunk from the memory pool 120, may correct an error of a message bit using a meta bit included in the data chunk, and may store the corrected message bit in the register 1175.

The message bit stored in the register 1175 may be output to the processor 119 or the host 200 through a direct memory access (DMA) engine (not illustrated).

Figure 5A:
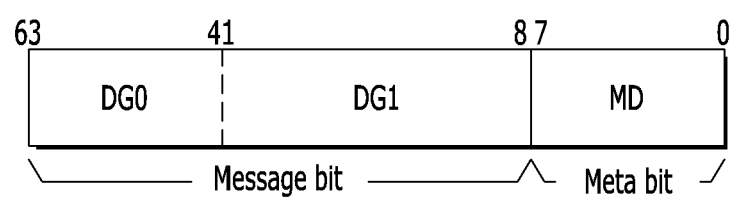
FIGS. 5A and 5B are diagrams illustrating an operation of a first ECC circuit according to an embodiment.
Figure 5B:
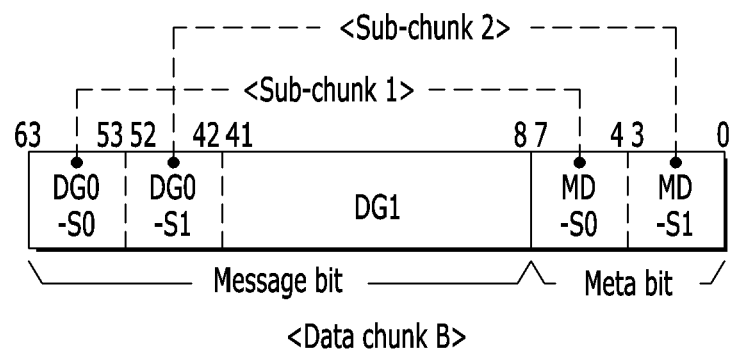

FIGS. 5A and 5B are diagrams illustrating an operation of the first ECC circuit 210 according to an embodiment.

Referring to FIG. 5A, a data chunk A derived by the first ECC circuit 210 may be configured with a message bit, including a first data group DG0 and a second data group DG1, and a meta bit including metadata MD.

The first data group DG0 may be "major data" from message bits generated in or during a process of processing an application and whose accuracy needs to be guaranteed (e.g., a sign and integer part or sign and exponent part of a weight used in a deep learning operation). The second data group DG1 may be "minor data" from message bits generated in or during a process of processing an application and may be lost or not used (e.g., the decimal part of a weight used in a deep learning operation).

The metadata MD may be a parity bit generated by encoding the first data group DG0 based on a set error correction code.

Referring to FIG. 5B, a data chunk B derived by the first ECC circuit 210 may be configured with a message bit, including a first data group DG0 and a second data group DG1, and a meta bit including metadata MD.

The first data group DG0 may include a first sub-data group DG0-S0 and a second sub-data group DG0-S1. The metadata MD may include a first sub-meta bit MD-S0 for the first sub-data group DG0-S0 and a second sub-meta bit MD-S1 for the second sub-data group DG0-S1.

The first sub-data group DG0-S0 and the first sub-meta bit MD-S0 may configure a first sub-chunk. The second sub-data group DG0-S1 and the second sub-meta bit MD-S1 may configure a second sub-chunk.

Figure 6:
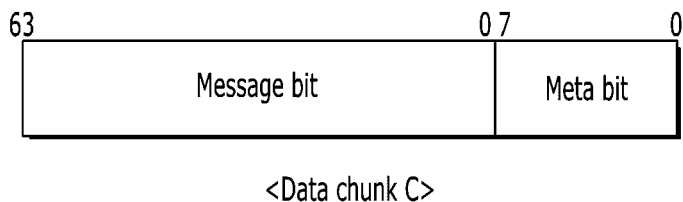
FIG. 6 is a diagram illustrating an operation of a second ECC circuit according to an embodiment.

FIG. 6 is a diagram for describing an operation of the second ECC circuit 220 according to an embodiment.

Referring to FIG. 6, a data chunk C derived by the second ECC circuit 220 may be configured with a message bit and a meta bit. The meta bit may be a parity bit generated by encoding the message bit based on a set error correction code.

In FIG. 5A, the first data group DG0 configuring the message bit may be 22 bits. Error correction may be performed on the first data group DG0 based on the meta bit MD of 8 bits.

In FIG. 5B, the first sub-data group DG0-S0 and the second sub-data group DG0-S1 configuring the message bit may each be 11 bits, for example. Error correction may be performed on the first sub-data group DG0-S0 and the second sub-data group DG0-S1 based on the meta bits MD-S0 and MD-S1 each having 4 bits.

When the meta bit is generated, an SEDDEC error correction code may be used. An error of at least one bit may be corrected from major data of 22 bits (FIG. 5A) or an error of 1 bit may be corrected from each of two major data groups each having 11 bits (FIG. 5B). Accordingly, error correction performance for major data is significantly improved or enhanced compared to a case where an error of 1 bit is corrected with respect to all message bits of 64 bits, as in FIG. 6.

Thus, because the accuracy of major data is guaranteed as described herein, power consumption can be reduced because the refresh cycle of the memory pool 120 is increased.

Figure 7:
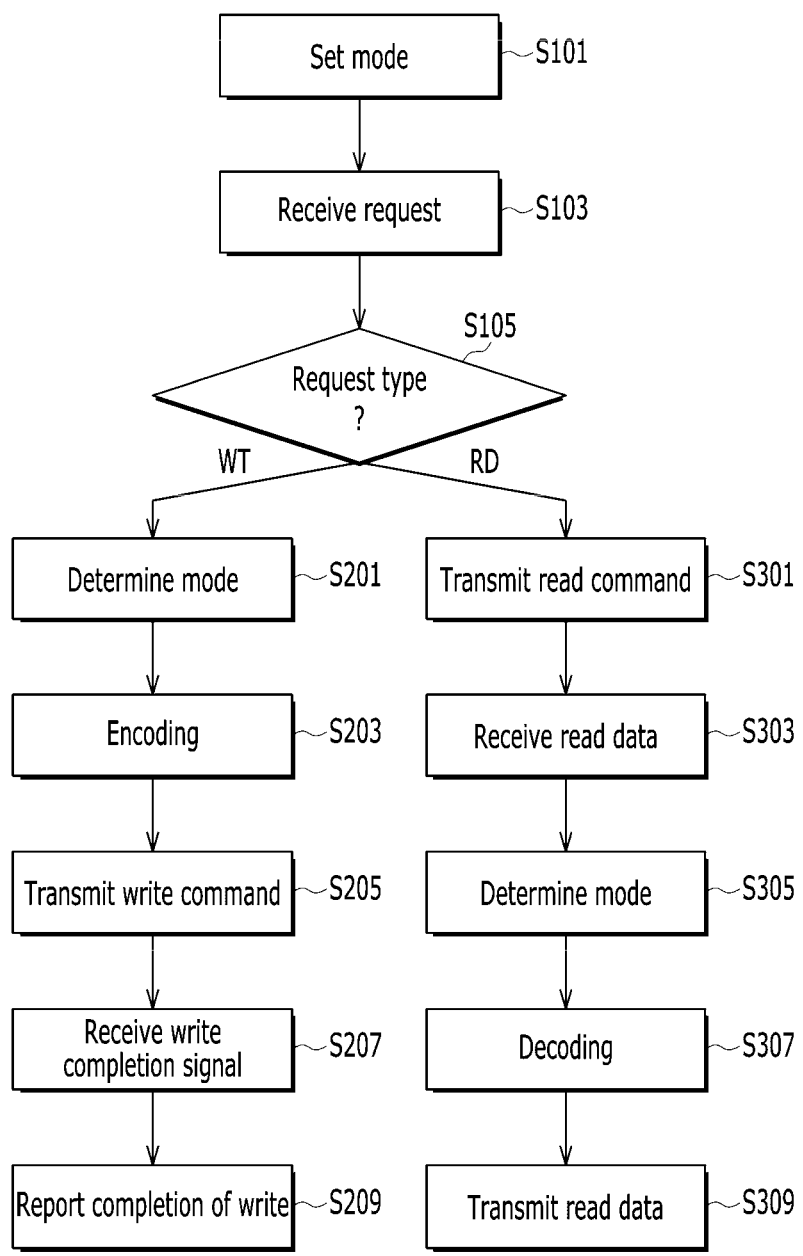
FIG. 7 is a flow diagram illustrating an operating method of a memory controller according to an embodiment.

FIG. 7 is a flowchart illustrating a method of operating the memory controller 117 according to an embodiment.

Referring to FIG. 7, the operation mode of the memory controller 117 may be set in response to a control signal CON received from the host 200 (S101). In an embodiment, the operation mode may be any one of the first operation mode (e.g., an acceleration application processing mode), and the second operation mode (e.g., a common application processing mode).

When receiving a request REQ from the host 200 or the processor 119 (S103), the memory controller 117 may store the received request REQ, and may determine a request type (S105) by parsing the request REQ.

If the request type is a write request WT, the memory controller 117 may determine the operation mode (S201), may selectively drive the first ECC circuit 210 or the second ECC circuit 220, and may encode a message bit included in the write request WT (S203).

In an embodiment, when the operation mode of the memory controller 117 is set as the first operation mode, the memory controller 117 may drive the first ECC circuit 210. The first ECC circuit 210 may perform an encoding operation of receiving a message bit included in the write request, generating a meta bit by extracting a first data group from the message bit, and configuring a data chunk.

In an embodiment, when the operation mode of the memory controller 117 is set as the second operation mode, the memory controller 117 may drive the second ECC circuit 220. The second ECC circuit 220 may perform an encoding operation of receiving a message bit included in the write request, generating a meta bit, and configuring a data chunk.

The memory controller 117 may transmit a write command (CMD=WT) to the memory pool 120 based on a result of the parsing of the request REQ (S205).

When the memory pool 120 stores the data chunk received from the ECC device 20 in response to the write command (CMD=WT) and transmits a completion signal (S207), the memory controller 117 may report the completion of the write operation to the host 200 or the processor 119 (S209).

If the request type is a read request RD, the memory controller 117 may transmit a read command (CMD=RD) to the memory pool 120 based on a result of the parsing of the request (S301).

Accordingly, when the data chunk is read from the memory pool 120 and the read data chunk is transmitted to the memory controller 117 (S303), the memory controller 117 may determine the operation mode (S305), may selectively drive the first ECC circuit 210 or the second ECC circuit 220, and may decode the read data chunk (S307).

In an embodiment, when the operation mode of the memory controller 117 is set as the first operation mode, the memory controller 117 may drive the first ECC circuit 210. The first ECC circuit 210 may perform a decoding operation of extracting a meta bit from a message chunk, correcting an error of a first data group, and generating a message bit.

In an embodiment, when the operation mode of the memory controller 117 is set as the second operation mode, the memory controller 117 may drive the second ECC circuit 220. The second ECC circuit 220 may perform a decoding operation of extracting a meta bit from a data chunk and correcting an error of a message bit.

The decoded message bit may be output to the processor 119 or the host 200 (S309).

Figure 8:
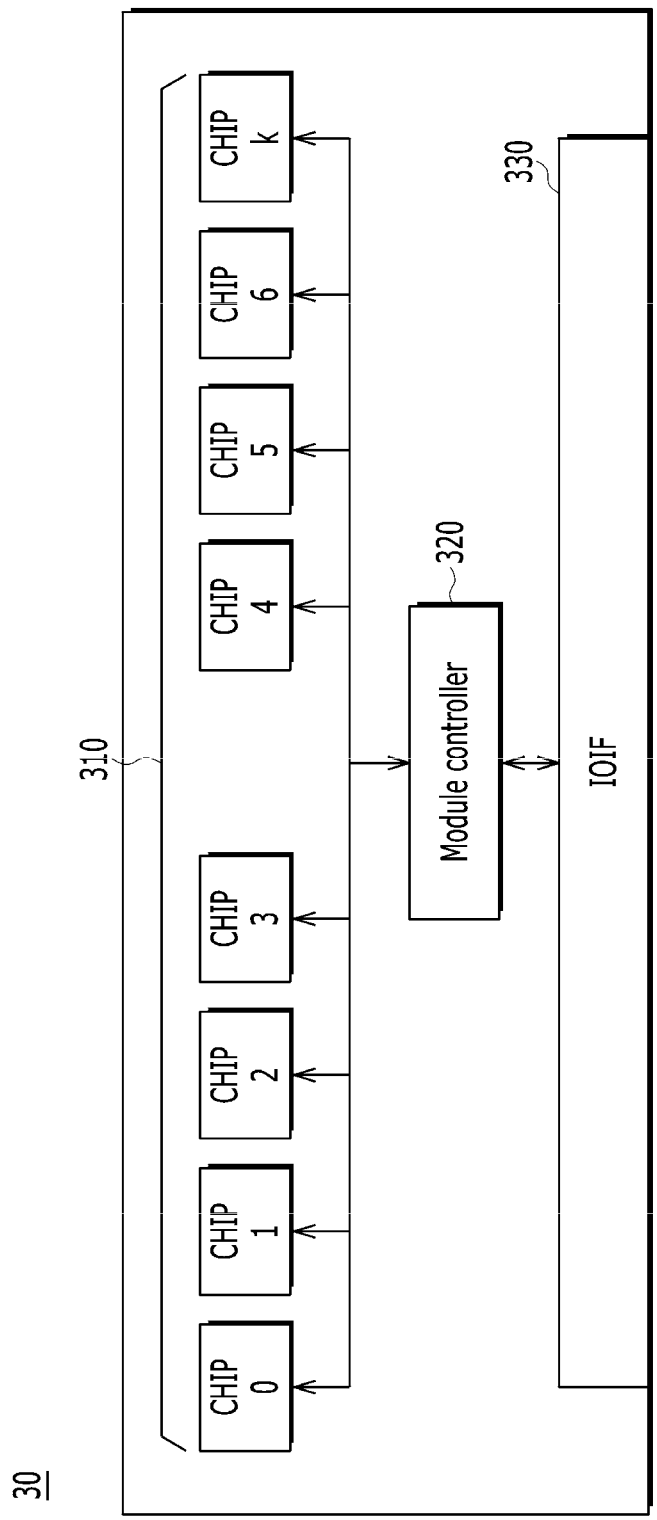
FIG. 8 is a diagram illustrating a configuration of a memory module according to an embodiment.

FIG. 8 is a diagram illustrating a configuration of a memory module 30 according to an embodiment.

Referring to FIG. 8, the memory module 30 may include a plurality of memory chips 310, a module controller 320 and an input and output interface (IOIF) 330 mounted on a module board 300 according to an embodiment.

Each of the plurality of memory chips 310 may be configured as a volatile memory device, for example, a DRAM, but the present disclosure is not limited thereto.

The module controller 320 may buffer a command, an address or a clock signal from the controller 110 and transmit the command, address or clock signal to the memory chip 310 through the IOIF 330, or may provide, to the controller 110, data received from the memory chip 310 through the IOIF 330.

In an embodiment, the module controller 320 may include an ECC device. The operation mode of the ECC device may be set under the control of the controller 110, the ECC device may perform error correction on only major data, included in a message bit, in the first operation mode, and may perform error correction on all message bits in the second operation mode.

Figure 9:
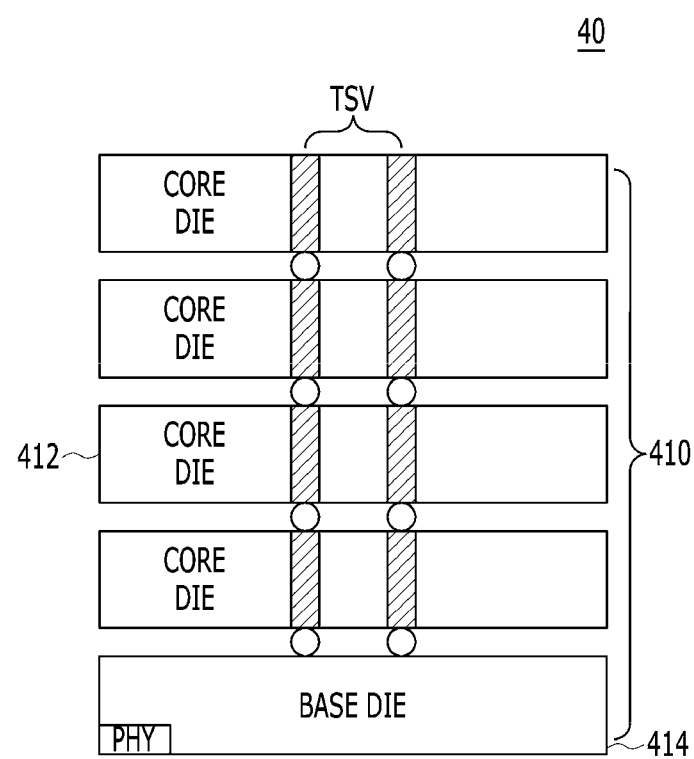
FIGS. 9, 10, and 11 illustrate stacked semiconductor apparatuses in accordance with embodiments.
Figure 10:
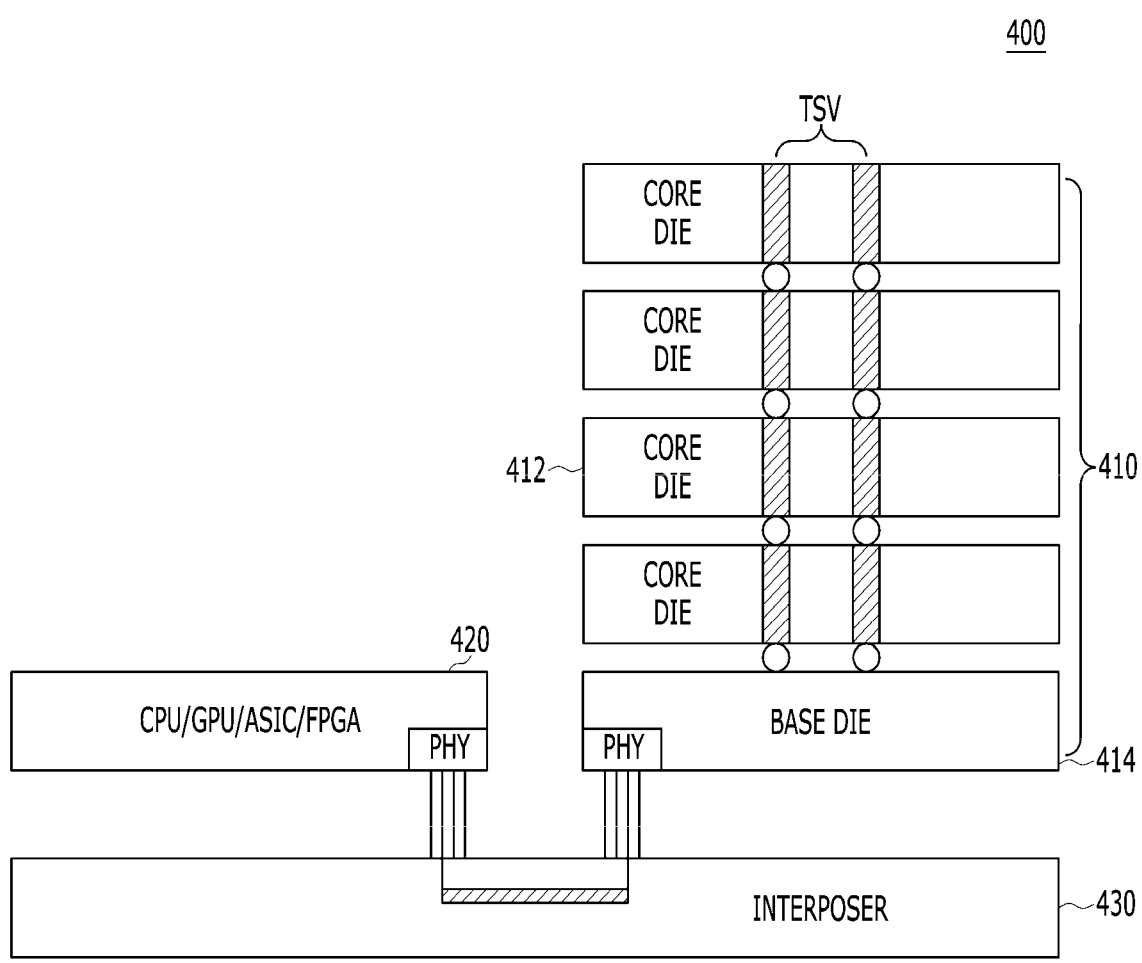
Figure 11:
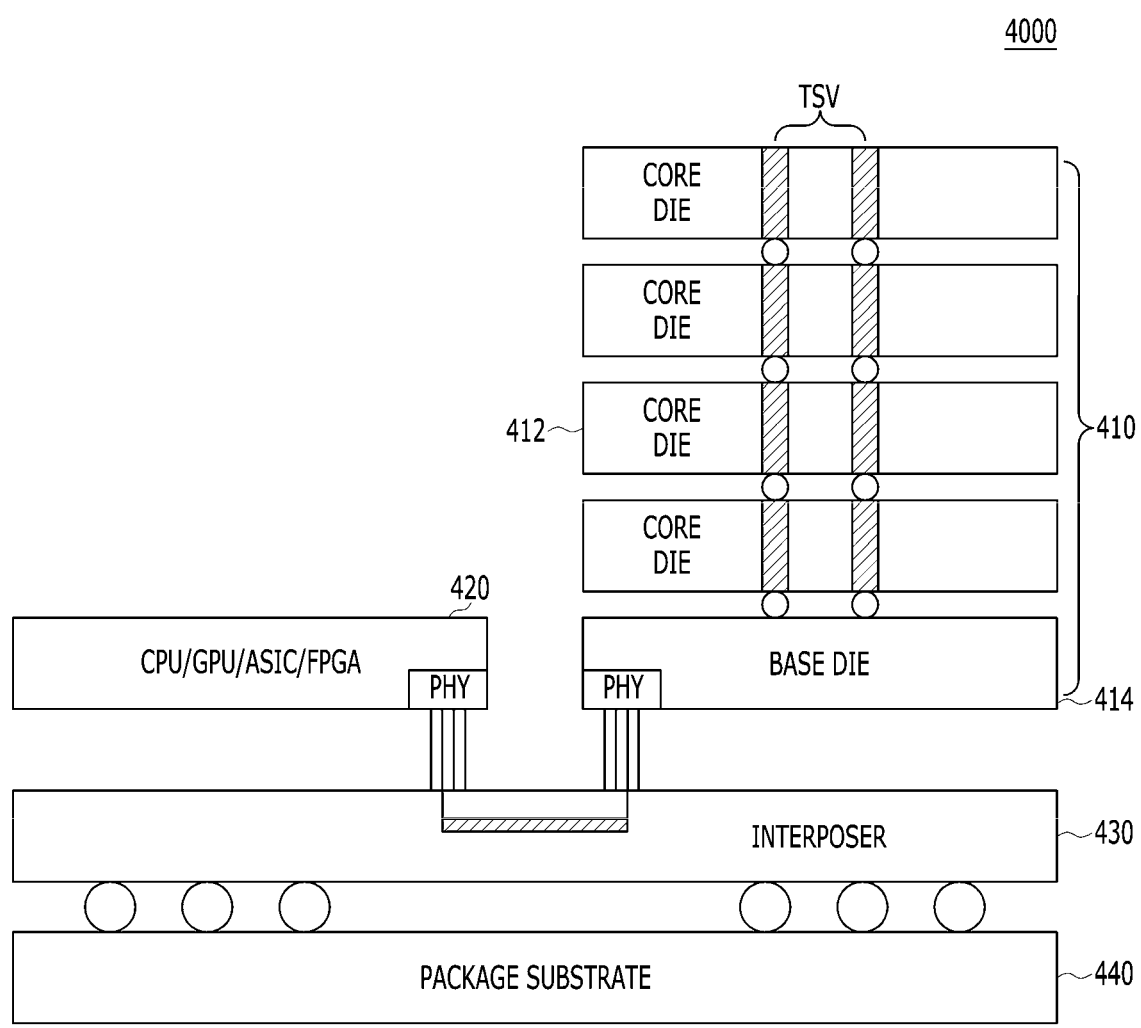

FIGS. 9 to 11 illustrate stacked semiconductor apparatuses in accordance with embodiments.

FIG. 9 illustrates a stacked semiconductor apparatus 40 in accordance with an embodiment.

The stacked semiconductor apparatus 40 may include a stack structure 410 in which a plurality of dies is stacked. The stack structure 410 may be configured in a high bandwidth memory (HBM) type in which the plurality of dies is stacked and electrically connected to one another via through-silicon vias (TSV), so that the number of input/output units is increased and thus a bandwidth is increased.

The stack structure 410 may include a base die 414 and a plurality of core dies 412.

The plurality of core dies 412 may be stacked on the base die 414 and electrically connected to one another via the through-silicon vias (TSV). In each of the core dies 412, memory cells for storing data and circuits for core operations of the memory cells may be disposed.

The core dies 412 may be electrically connected to the base die 414 via the through-silicon vias (TSV) and receive signals, power and the like from the base die 414 via the through-silicon vias (TSV).

The base die 414, for example, may include the controller 300 and the memory apparatus 200 illustrated in FIGS. 1 to 3. The base die 414 may perform various functions in the stacked semiconductor apparatus 40, for example, memory management functions such as power management and refresh of the memory cells or timing adjustment functions between the core dies 412 and the base die 414.

A physical interface area PHY included in the base die 414 may be an input/output area of an address, a command, data, a control signal and the like. The physical interface area PHY may be provided with a predetermined number of input/output circuits capable of satisfying a data processing speed required for the stacked semiconductor apparatus 40. A plurality of input/output terminals and a power supply terminal may be provided in the physical interface area PHY on the rear surface of the base die 414 to receive signals and power required for an input/output operation.

FIG. 10 illustrates a stacked semiconductor apparatus 400 in accordance with an embodiment.

The stacked semiconductor apparatus 400 may include a stack structure 410 of a plurality of core dies 412 and a base die 414, a memory host 420, and an interface substrate 430. The memory host 420 may be a CPU, a GPU, an application specific integrated circuit (ASIC), a field programmable gate arrays (FPGA) and so on.

The base die 414 may be provided with a circuit for an interface between the core dies 412 and the memory host 420. The stack structure 410 may have a structure similar to that described with reference to FIG. 9.

A physical interface area PHY of the stack structure 410 and a physical interface area PHY of the memory host 420 may be electrically connected to each other through the interface substrate 430. The interface substrate 430 may be referred to as an interposer.

FIG. 11 illustrates a stacked semiconductor apparatus 4000 in accordance with an embodiment.

It may be understood that the stacked semiconductor apparatus 4000 illustrated in FIG. 11 is obtained by disposing the stacked semiconductor apparatus 400 illustrated in FIG. 10 on a package substrate 440.

The package substrate 440 and the interface substrate 430 may be electrically connected to each other through connection terminals.

A system in package (SiP) type semiconductor apparatus may be implemented by staking the stack structure 410 and the memory host 420, which are illustrated in FIG. 10, on the interface substrate 430 and mounting them on the package substrate 440 for the purpose of package.

Figure 12:
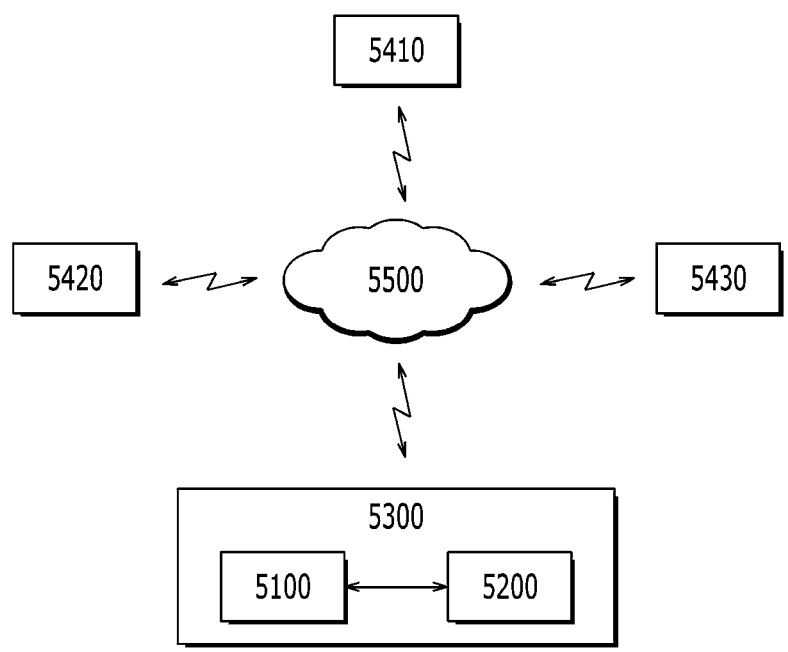
FIG. 12 illustrates a network system including a data storage device in accordance with an embodiment.

FIG. 12 is a diagram illustrating a network system 5000 including a data storage device, in accordance with an embodiment. Referring to FIG. 12, the network system 5000 may include a server system 5300 and a plurality of client systems 5410, 5420, and 5430, which are coupled through a network 5500.

The server system 5300 may service data in response to requests from the plurality of client systems 5410 to 5430. For example, the server system 5300 may store the data provided by the plurality of client systems 5410 to 5430. For another example, the server system 5300 may provide data to the plurality of client systems 5410 to 5430.

The server system 5300 may include a host device 5100 and a memory system 5200. The memory system 5200 may include one or more of the data processing system 100 shown in FIG. 2, the stacked semiconductor apparatuses 40 shown in FIG. 9, the stacked semiconductor apparatus 400 shown in FIG. 10, or the stacked semiconductor apparatus 4000 shown in FIG. 11, or combinations thereof.

While various embodiments have been described above, it will be understood to those skilled in the art that the embodiments described are examples only. Accordingly, the data processing system and the operating method thereof described herein should not be limited based on the described embodiments.

Although various embodiments have been described for illustrative purposes, it will be apparent to those skilled in the art that various changes and modifications may be made without departing from the spirit and scope of the disclosure as defined in the following claims.

What is claimed is:

1. A data processing system, comprising:
   a memory module; and
   a controller configured to exchange data with the memory module in response to a request received from a host, wherein the controller is configured to:
   divide a first data into a first data group which is a set number of upper bits of the first data and is for error correction and a second data group which is at least part of the first data excluding the first data group and is not for error correction in response to the first data and a first data write request received from the host;
   generate a first meta data for error correction for the first data group based on the first data group;
   configure a first data chunk that including the first data and the first meta data; and
   transmit the first data chunk to the memory module.

2. The data processing system of claim 1, wherein the controller is configured to:
   receive the first data chunk from the memory module in response to a first data read request received from the host;
   generate a first read data by correcting an error of the first data group based on the first meta data; and
   transmit the first read data to the host.

3. The data processing system of claim 1, wherein the first data group comprises a first sub-data group and a second sub-data group.

4. The data processing system of claim 3, wherein the first meta data comprises a first sub-meta data for the first sub-data group and a second sub-meta data for the second sub-data group.

5. The data processing system of claim 1, wherein the controller is further configured to control the second data group not to be used during the generation of the first meta data.

6. The data processing system of claim 1, wherein the first data corresponding to first data write request is a data for an artificial intelligence application processing including a neural network operation.

7. The data processing system of claim 6, wherein:
   the first data corresponding to first data write request is an integer of a weight used in the neural network operation.

8. The data processing system of claim 1, wherein the controller is configured to:
   generate a second meta data for error correction with respect to a second data in response to the second data and a second data write request received from the host;
   configure a second data chunk that includes the second data and the second meta data; and
   transmit the second data chunk to the memory module.

9. The data processing system of claim 8, wherein the controller is configured to:
   receive the second data chunk from the memory module in response to a second data read request received from the host;
   generate a second read data by correcting an error of the second data based on the second meta data; and
   transmit the second read data to the host.

10. A memory controller configured to exchange data with a memory module in response to a request received from a host, the memory controller configured to:
    perform an error check and correction operation by:
    generating a meta data based on a data received from the host; and
    transmitting, to the memory module, a data chunk that includes the data and the meta data to store the data chunk in the memory module;
    wherein the data includes:

a first part, which is a set number of upper bits of the data and is used to generate the meta data used for error correction; and a second part, which is at least part of the data excluding the first part, that is not used to generate the meta data used for error correction when an operation mode of the memory controller is a first operation mode and that is used to generate the meta data used for error correction when the operation mode of the memory controller is a second operation mode.

11. The memory controller of claim 10, wherein the memory controller is further configured to:

set the operation mode of the memory controller to the first operation mode or the second operation mode based on a type of application for which processing has been requested by the host;

perform the error check and correction operation based on the set operation mode and in response to the request received from the host;

transmit a command to the memory module; and perform the error check and correction operation based on a first meta data for the first part of the data when the operation mode of the memory controller is set to the first operation mode.

12. The memory controller of claim 11, wherein the memory controller is further configured to, when the operation mode of the memory controller is configured to the second operation mode, perform the error check and correction operation based on a second meta data for the data including the first part and the second part.

13. The memory controller of claim 11, wherein the first operation mode is an artificial intelligence application processing mode including a neural network operation.

14. The memory controller of claim 13, wherein:

the first part is an integer part of a weight used in the neural network operation.

15. The memory controller of claim 10, wherein the first part comprises a first sub-data group and a second sub-data group.

16. The memory controller of claim 15, wherein the first meta data comprises a first sub-meta data for the first sub-data group and a second sub-meta data for the second sub-data group.

17. A method of operating a memory controller that exchanges data with a memory module in response to a request received from a host, the method comprising:

dividing, by the memory controller, a first data into a first data group which is a set number of upper bits that form the first data and is for error correction and a second data group which is at least part of the first data excluding the first data group and is not for error correction in response to the first data and a first data write request received from the host;

generating, by the memory controller, a first meta data for error correction for the first data group based on the first data group; and transmitting, by the memory controller, to the memory module, a first data chunk that includes the first data and the first meta data.

18. The method of claim 17, further comprising:

receiving the first data chunk from the memory module when a first read request for the first data is received from the host;

generating a first read data by correcting an error of the first data group based on the first meta data; and transmitting the first read data to the host.

19. The method of claim 17, further comprising:

generating a second meta data for error correction using a second data in response to the second data and a second data write request received from the host; and transmitting, to the memory module, a second data chunk that includes the second data and the second meta data.

20. The method of claim 19, further comprising:

receiving the second data chunk from the memory module when a second read request for the second data is received from the host;

generating the second read data by correcting an error of the second data based on the second meta data; and transmitting the read data to the host.

21. The operating method of claim 17, wherein:

the first data group comprises a first sub-data group and a second sub-data group; and generating the first meta data for error correction includes generating a first sub-meta data for the first sub-data group and a second sub-meta data for the second sub-data group.

22. The method of claim 17, wherein the generated first meta data does not include the second data group of the first data.

23. The operating method of claim 17, wherein the data corresponding to the first data write request is a data for an artificial intelligence application processing mode including a neural network operation.

* * * * *